US012625161B2

(12) United States Patent
    Takahashi et al.

(10) Patent No.: US 12,625,161 B2
(45) Date of Patent: May 12, 2026

(54) SEMICONDUCTOR MODULE INSPECTION DEVICE

(71) Applicant: NTT, Inc., Tokyo (JP)

(72) Inventors: Masayuki Takahashi, Musashino (JP); Kentaro Honda, Musashino (JP)

(73) Assignee: NTT, Inc., Tokyo (JP)

( * ) Notice: Subject to any disclaimer, the term of this patent is extended or adjusted under 35 U.S.C. 154(b) by 145 days.

(21) Appl. No.: 18/685,064

(22) PCT Filed: Sep. 3, 2021

(86) PCT No.: PCT/JP2021/032535
    § 371 (c)(1),
    (2) Date: Feb. 20, 2024

(87) PCT Pub. No.: WO2023/032176
    PCT Pub. Date: Mar. 9, 2023

(65) Prior Publication Data
    US 2025/0130252 A1     Apr. 24, 2025

(51) Int. Cl.
    *G01R 1/04*      (2006.01)
    *G01R 31/26*     (2020.01)
(52) U.S. Cl.
    CPC ....... *G01R 1/0458* (2013.01); *G01R 31/2601* (2013.01)
(58) Field of Classification Search
    CPC ........................... G01R 1/045; G01R 31/2601
    See application file for complete search history.

(56) References Cited

U.S. PATENT DOCUMENTS 6,551,844 B1 * 4/2003 Eldridge ............ G01R 1/07342
                                                        257/E23.068
8,228,083 B2 * 7/2012 Shen .................... G01R 1/0466
                                                        324/754.01
                    (Continued)

FOREIGN PATENT DOCUMENTS

JP        2003-028920 A      1/2003
JP        2007-141611 A      6/2007
                    (Continued)

OTHER PUBLICATIONS

P. Maniotis et al., *Scaling HPC Networks with Co-Packaged Optics*, T3K.7.pdf, OFC 2020, Mar. 2020, pp. 1-3.

*Primary Examiner* — Reena Aurora
(74) *Attorney, Agent, or Firm* — Workman Nydegger

(57)         ABSTRACT

A semiconductor module inspection device of the present disclosure includes a PCB substrate, an IC socket that accommodates a semiconductor module disposed on a first main surface of the PCB substrate, a first temperature control device disposed in contact with an upper surface of the IC socket, and a second temperature control device disposed in contact with a second main surface of the PCB substrate. In an embodiment, the first temperature control device and the second temperature control device have a Peltier element and a heat dissipation fin. In an embodiment, the semiconductor module inspection device further includes a chamber structure including a chamber upper portion connected to the heat dissipation surface of the first temperature control device, a chamber lower portion connected to the heat dissipation surface of the second temperature control device, and a purge mechanism for purging the chamber internal space with dried air.

13 Claims, 7 Drawing Sheets

(56) References Cited

U.S. PATENT DOCUMENTS

| | | | | |
|---|---|---|---|---|
| 9,625,521 | B2 * | 4/2017 | Lindsey | G01R 1/0491 |
| 2023/0024045 | A1 * | 1/2023 | Ho | G01R 1/07314 |

FOREIGN PATENT DOCUMENTS

| | | |
|---|---|---|
| JP | 2008-196920 A | 8/2008 |
| JP | 2013-076641 A | 4/2013 |
| JP | 2020-194041 A | 12/2020 |
| WO | 2020/188844 A1 | 9/2020 |

* cited by examiner

IC MODULE INSPECTION DEVICE 10b

HEAT DISSIPATION FIN 18

PELTIER ELEMENT 17

OPTICAL SEMICONDUCTOR MODULE 20

CONTACT PIN 13

CABLE 15

CONNECTOR 14

PCB 11

IC SOCKET 12

OPTICAL FIBER 21

Figure 3A:
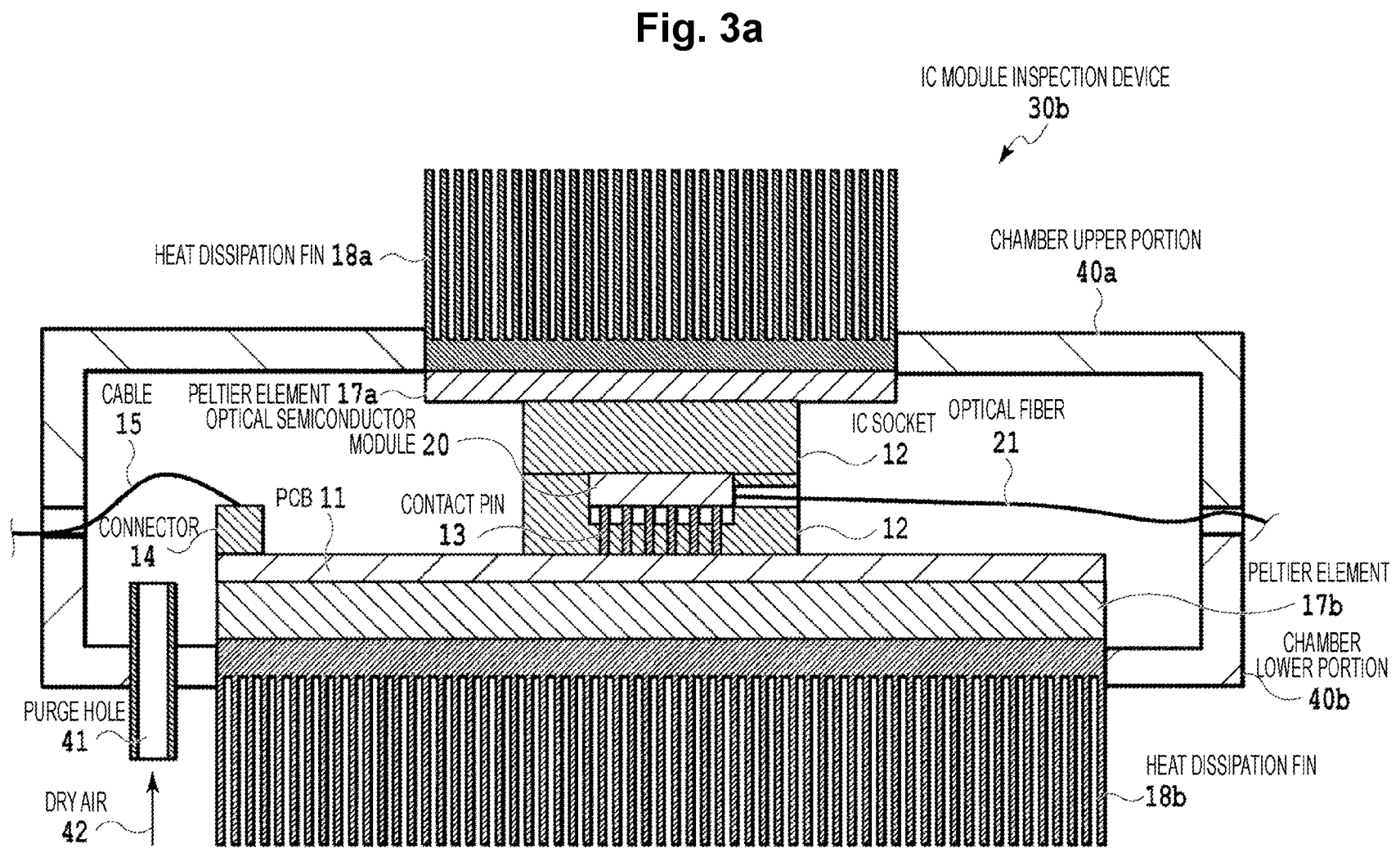

IC MODULE INSPECTION DEVICE
30b

CHAMBER UPPER PORTION
40a

PELTIER ELEMENT
17b

CHAMBER LOWER PORTION
40b

HEAT DISSIPATION FIN
18b

OPTICAL FIBER
21

IC SOCKET
12

12

HEAT DISSIPATION FIN 18a

PELTIER ELEMENT 17a
OPTICAL SEMICONDUCTOR MODULE 20

CONTACT PIN
13

PCB 11

CABLE
15

CONNECTOR
14

PURGE HOLE
41

DRY AIR
42

Fig. 3b

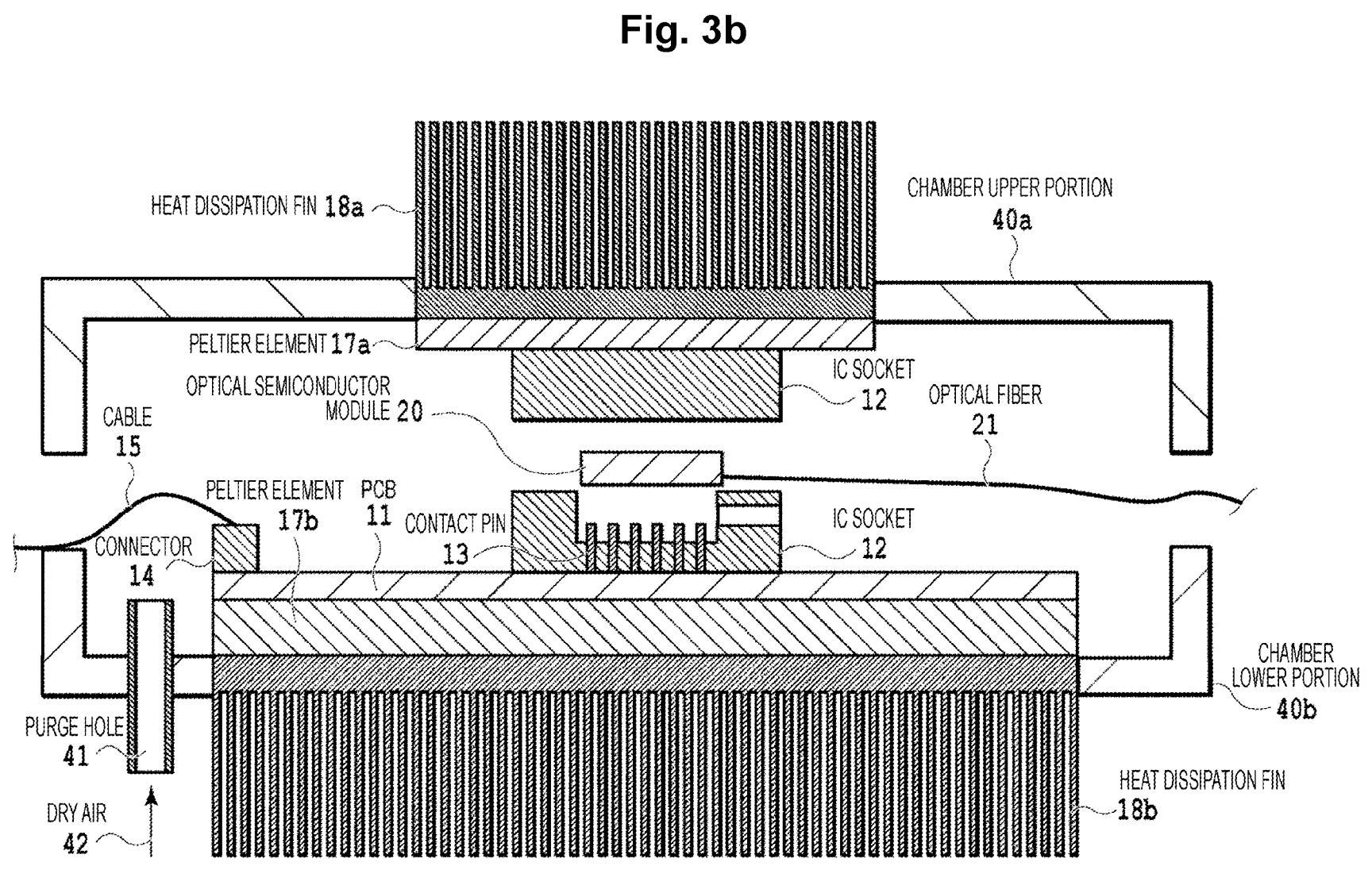

CHAMBER UPPER PORTION 40a

CHAMBER LOWER PORTION 40b

HEAT DISSIPATION FIN 18b

OPTICAL FIBER 21

IC SOCKET 12

IC SOCKET 12

HEAT DISSIPATION FIN 18a

PELTIER ELEMENT 17a

OPTICAL SEMICONDUCTOR MODULE 20

PELTIER ELEMENT 17b

PCB 11

CONTACT PIN 13

CABLE 15

CONNECTOR 14

PURGE HOLE 41

DRY AIR 42

SEMICONDUCTOR MODULE INSPECTION DEVICE

TECHNICAL FIELD

The present disclosure relates to a semiconductor module inspection device.

BACKGROUND ART

In recent years, in order to cope with an increase in communication traffic, miniaturization, low power, and high speed of an optical communication transceiver have come to be required. The optical semiconductor module including the optical communication transceiver includes an optical modulator that converts an electrical signal into a transmission optical signal, a photodiode that converts a reception optical signal into an electrical signal, and an optical circuit chip that connects these components. In addition, an amplifier circuit for driving an optical modulator or a photodiode, a control circuit, and a digital signal processing circuit may also be included in the electronic/optical circuit.

In recent years, research and development on optical semiconductor modules including a ball grid array (BGA) and a land grid array (LGA) as a small and high-speed input/output interface for an electrical signal has been conducted. Such an optical semiconductor module is called Co-packaged Optics, and has been actively researched and developed in recent years. (For example, Non Patent Literature 1)

In shipment inspection of an optical semiconductor module including such a BGA, inspection using an IC socket is performed similarly to an integrated circuit (IC) or an IC module (IC package) including a general BGA not including an optical semiconductor such as a processor or an application specific integrated circuit (ASIC). The IC socket includes a contact pin, and various electrical characteristics can be inspected by bringing a terminal portion of the accommodated IC module into contact with the contact pin and allowing conduction. (Patent Literature 1)

When an IC module is inspected in a temperature environment, a non-contact type temperature control device (environmental tester) that jets jet air at about −100° C. to 300° C. to an IC socket is used to change the ambient temperature environment for each IC socket in general.

As a method of easily changing the temperature, a method of changing the upper surface temperature of the IC module by attaching a contact-type temperature control device such as a Peltier element or a fin to the upper portion of the IC socket is also used.

CITATION LIST

Patent Literature

Patent Literature 1: JP 2020-194041 A

Non Patent Literature

Non Patent Literature 1: P. Maniotis et al., "Scaling HPC Networks with Co-Packaged Optics", T3K.7, OFC2020, March 2020

SUMMARY OF INVENTION

Since the jet air causes shaking of the optical fiber connected to the optical semiconductor module, there is a problem that an inspection result of the optical semiconductor module is affected. In addition, when the temperature control device is attached to the upper portion of the IC socket, there is a problem that a temperature distribution occurs in the optical semiconductor module.

The present disclosure has been made in view of such a problem, and an object of the present disclosure is to provide a semiconductor module inspection device that is easily temperature-controllable and particularly suitable for an optical semiconductor module.

In order to achieve such an object, a semiconductor module inspection device according to an embodiment of the present invention includes a PCB substrate, an IC socket that accommodates a semiconductor module disposed on a first main surface of the PCB substrate, a first temperature control device disposed in contact with an upper surface of the IC socket, and a second temperature control device disposed in contact with a second main surface of the PCB substrate.

As described above, according to one embodiment of the present invention, it is possible to provide a semiconductor module inspection device that can be easily temperature-controlled, particularly suitable for an optical semiconductor module.

BRIEF DESCRIPTION OF DRAWINGS

FIG. 3a is a schematic configuration diagram of a semiconductor module inspection device according to an embodiment of the present invention.

FIG. 3b is a schematic configuration diagram of the semiconductor module inspection device according to an embodiment of the present invention.

DESCRIPTION OF EMBODIMENTS

Figure 1A:
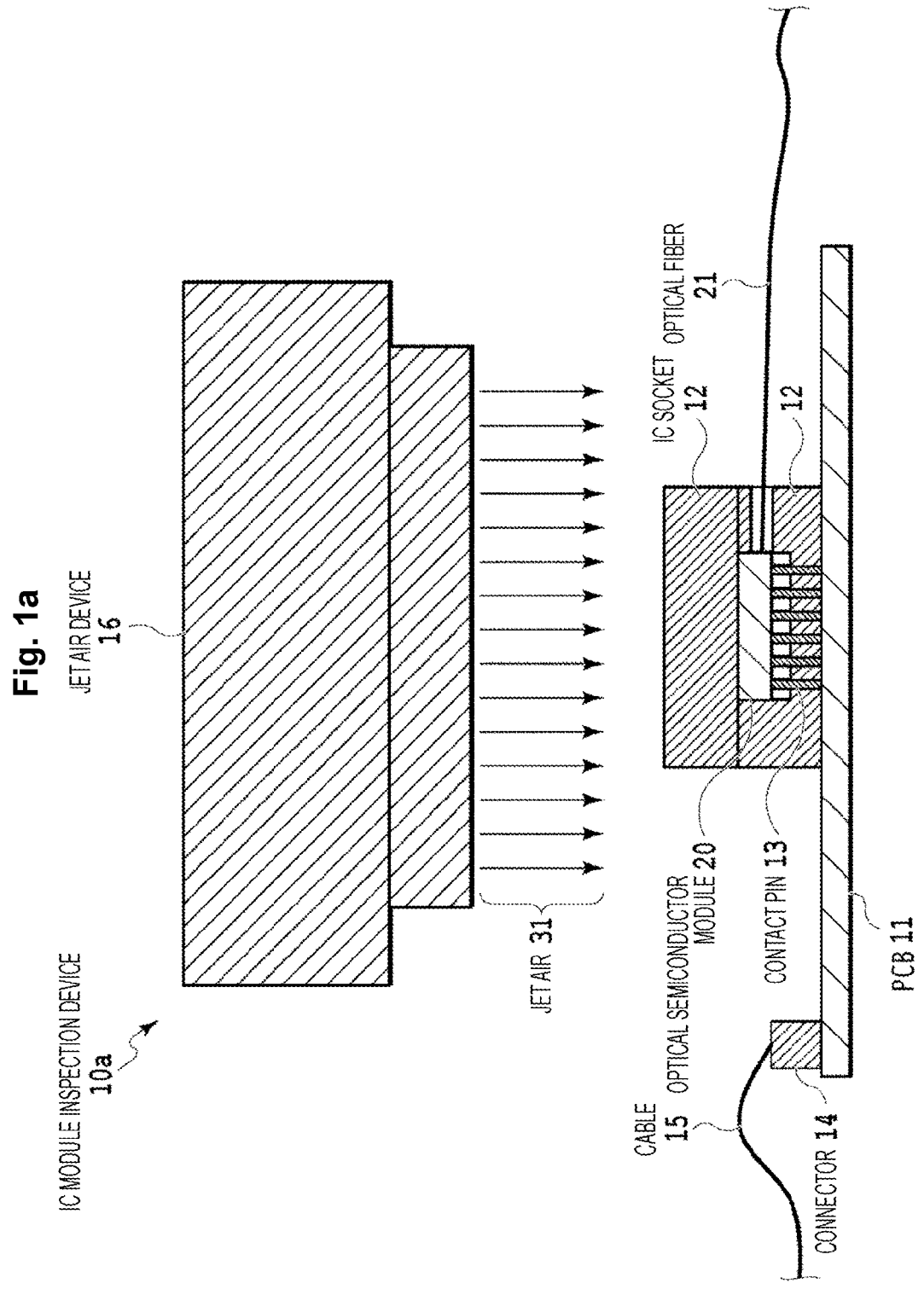
FIG. 1a is a schematic configuration diagram of an environmental tester.

A detailed description of embodiments of the present invention will be described below with reference to the drawings. The same or similar reference numerals denote the same or similar components, and repetitive explanation of them will not be made in some cases. The following description of the embodiments is exemplary, and some configurations may be changed, omitted, or added without departing from the gist.

Before describing an embodiment of the present invention, an example of a conventional IC module inspection device will be described with reference to FIGS. 1a to 1c.

FIG. 1a is a schematic configuration diagram of a jet air jetting-type semiconductor module inspection device as an environmental tester. An IC module inspection device 10a which is an inspection device is a device that inspects a semiconductor module such as the IC module or an optical semiconductor module 20. FIG. 1a illustrates the optical semiconductor module 20 including an LGA to which an optical fiber 21 is connected as a semiconductor module. The IC module inspection device 10a includes a printed circuit board (PCB) 11 as a development board, an IC socket 12 disposed on the PCB 11, and a jet air device 16 that jets jet air 31 from above the IC socket 12 toward a test environment including a semiconductor module mounted on the IC socket 12. The IC socket 12 is made of a metal material such as aluminum and a resin material for insulation. Further, the IC socket 12 has a contact pin 13 for connecting a terminal (for example, a fine flat electrode (land)) of the mounted semiconductor module to wiring (not illustrated) on the PCB 11. The wiring on the PCB 11 is connected with a connector 14 disposed near an edge of the PCB 11. A cable 15 is connected to the connector 14. The cable 15 is connected to, for example, a control unit and a measurement unit (not illustrated) of the inspection device. The optical fiber 21 is connected to a light receiving unit and a light emitting unit (not illustrated) of the inspection device. The IC module inspection device 10a is a jet air jetting-type environmental tester, and can change the temperature including the ambient temperature by the jet air device 16 as a non-contact type temperature control device. Under such a test environment, power is supplied to the semiconductor module via the cable 15, the wiring on the PCB 11, and the contact pin 13, and an electric signal such as a control signal and an output signal is input/output, and an optical signal is input/output via the optical fiber 21, whereby the module is inspected.

Figure 1B:
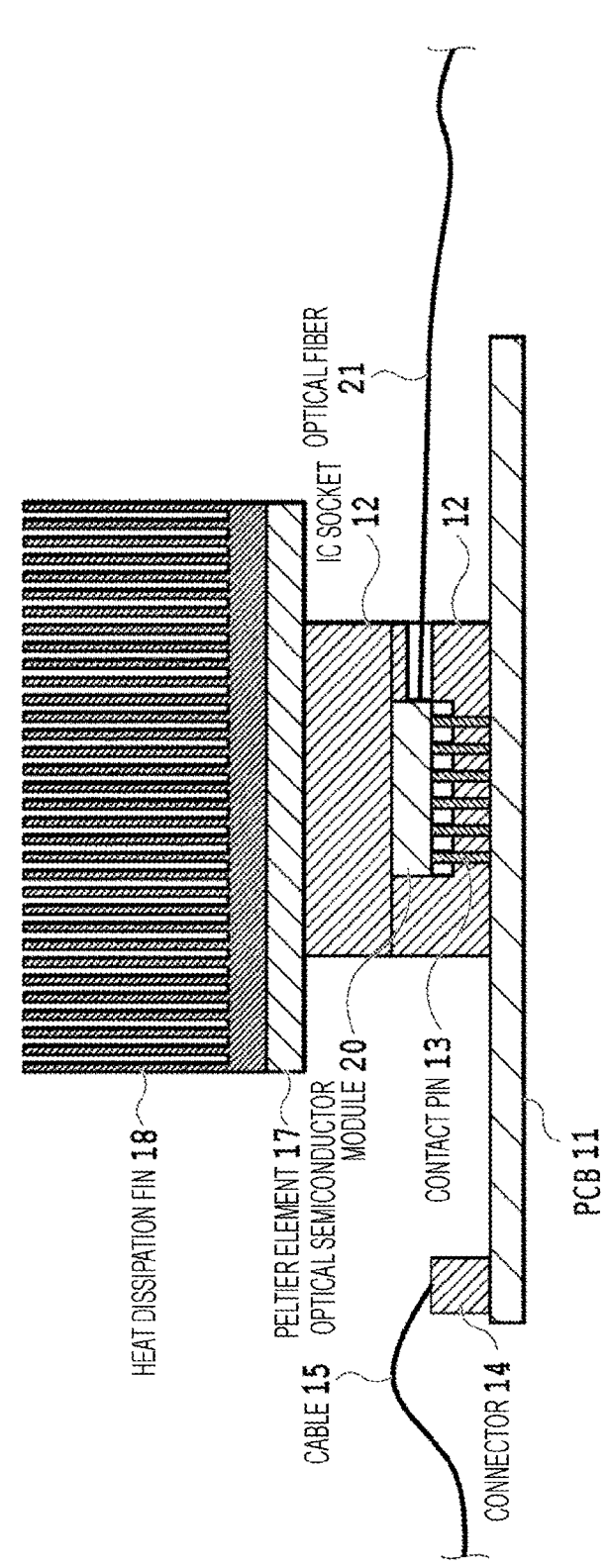
FIG. 1b is a schematic configuration diagram of a semiconductor module inspection device including a temperature control device.

FIG. 1b is a schematic configuration diagram of a semiconductor module inspection device including a contact type temperature control device. Similarly to the IC module inspection device 10a of FIG. 1a, the IC module inspection device 10b of FIG. 1b includes the PCB 11 and the IC socket 12 having the contact pin 13. The IC module inspection device 10b further includes a Peltier element 17 as a temperature control device provided on the upper portion of the IC socket 12, and a heat dissipation fin 18 that cools a Peltier element 17. The Peltier element 17 and the heat dissipation fin 18 can change the temperature of the test environment including the semiconductor module mounted on the IC socket 12.

Figure 1C:
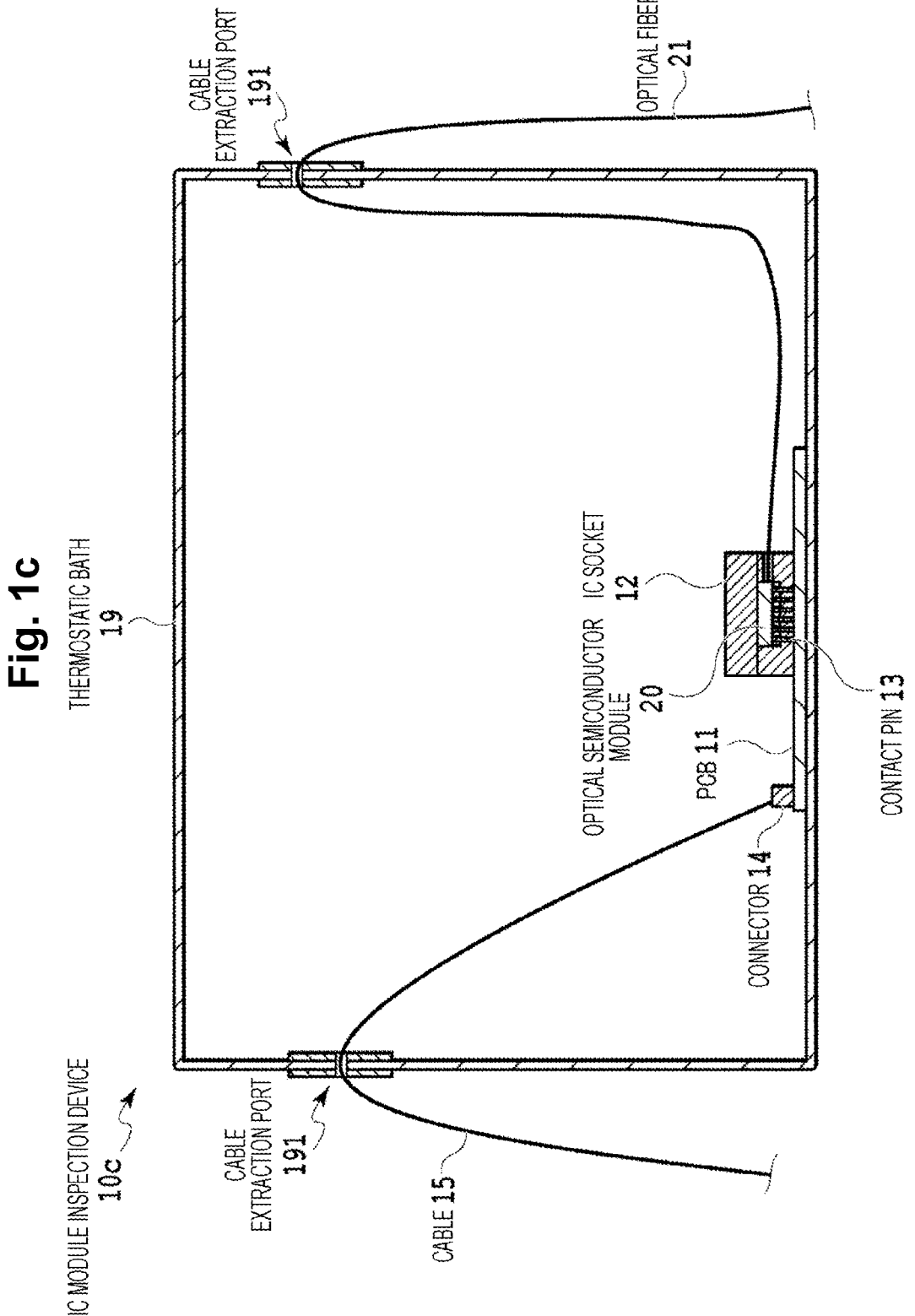
FIG. 1c is a schematic configuration diagram of a semiconductor module inspection device including a thermostatic bath.

FIG. 1c is a schematic configuration diagram of a semiconductor module inspection device including a thermostatic bath. Similarly to the IC module inspection device 10a of FIG. 1a, an IC module inspection device 10c of FIG. 1c includes the IC socket 12 disposed on the PCB 11, and a thermostatic bath 19 that controls and holds the temperature of the test environment including the semiconductor module mounted to the IC socket 12. The thermostatic bath 19 includes a cable extraction port 191 for extracting the cable 15 connected to the connector 14 disposed near the edge of the PCB 11 and the optical fiber 21 connected to the optical semiconductor module 20. The semiconductor module is inspected in a state where the entire IC socket 12 with the semiconductor module mounted is put inside the thermostatic bath 19.

In the example of the semiconductor module inspection device of FIGS. 1a to 1c, the configuration in which the optical semiconductor module 20 including the LGA is inspected is illustrated, but also in the case of inspecting the optical semiconductor module including the BGA, the IC socket can be used similarly to the optical semiconductor module including the LGA.

In the optical semiconductor module 20, an optical fiber 21 is connected as an input/output unit of an optical signal. Therefore, in the jet air jetting-type environmental tester (IC module inspection device 10a) of FIG. 1a, there is a problem that the optical fiber 21 swings, the polarization state of the optical signal passing through the optical fiber 21 changes, and the inspection result is affected.

In the case of using the contact type temperature control device (IC module inspection device 10b) of FIG. 1b, the influence of the shaking of the optical fiber 21 by the jet air is eliminated, but only the temperature on the upper surface side of the optical semiconductor module 20 can be changed, so that a difference in temperature is generated between the upper surface side and the bottom surface side (contact pin 13 side) of the optical semiconductor module 20. This is not a problem in the case of a general IC module. However, since an optical circuit is generally more sensitive to being affected by temperature characteristics than an electronic circuit, there is a problem that it is necessary to adjust the temperature of not only the bottom surface of the optical semiconductor module 20 but also the entire optical semiconductor module.

In the case of using the semiconductor module inspection device (IC module inspection device 10c) including the thermostatic bath of FIG. 1c, the entire IC socket 12 is accommodated in the thermostatic bath 19, so that the optical fiber 21 does not shake, and the temperature of the optical semiconductor module 20 can be uniformly adjusted. However, since the thermostatic bath 19 is generally expensive and large, it is difficult to parallelize the control unit, the measurement unit, the light receiving unit, and the light emitting unit of the inspection device. Furthermore, since the thermostatic bath 19 is large, the optical fiber 21 connected to the optical semiconductor module 20 for inspection becomes long, and there is a problem in terms of handling of the optical fiber 21 and cost.

Next, a semiconductor module inspection device according to an embodiment of the present invention will be described with reference to FIGS. 2, 3a, 3b, and 4. The semiconductor module inspection device according to the embodiment of the present invention includes a PCB substrate, an IC socket that accommodates a semiconductor module disposed on a first main surface of the PCB substrate, a first temperature control device disposed in contact with an upper surface of the IC socket, and a second temperature control device disposed in contact with a second main surface of the PCB substrate.

First Embodiment

Figure 2:
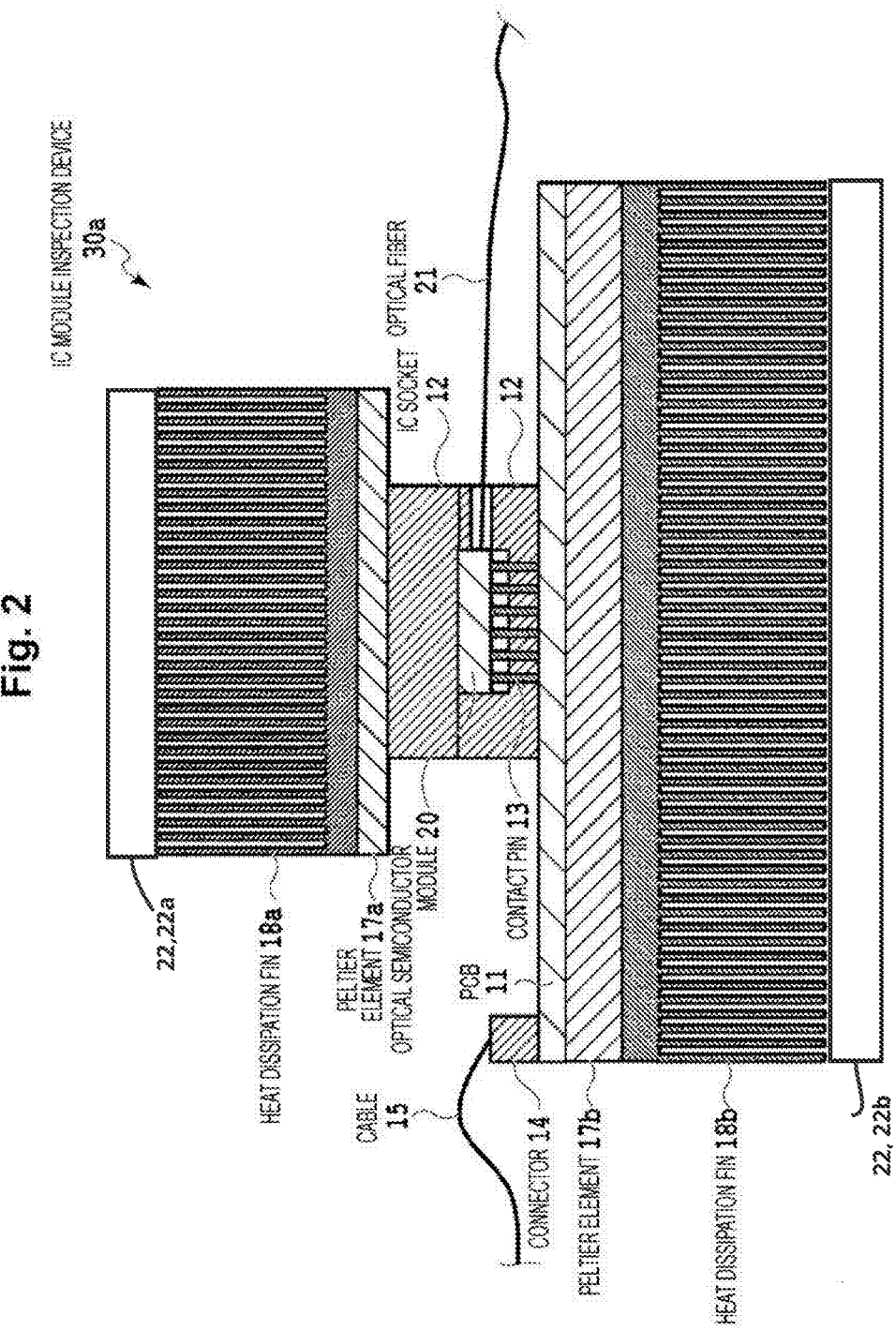
FIG. 2 is a schematic configuration diagram of a semiconductor module inspection device according to an embodiment of the present invention.

FIG. 2 is a diagram schematically illustrating a semiconductor module inspection device according to a first embodiment of the present invention. As illustrated in FIG. 2, an IC module inspection device 30a that is a semiconductor module inspection device includes the PCB 11, the IC socket 12 having the contact pin 13 disposed on the PCB 11, and a heat dissipation fin 18a that cools a Peltier element 17a and a Peltier element 17a as a contact type temperature control device provided on an upper portion of the IC socket 12. Similarly to the IC socket 12 illustrated in FIGS. 1a to 1c, the IC socket 12 is made of a metal material such as aluminum and a resin material for insulation. The semiconductor module mounted to the IC socket 12 is the optical semiconductor module 20 including the LGA, and the optical fiber 21 is connected thereto.

The heat dissipation fin 18a includes a plate-shaped base and a fin portion. The fin portion has a plurality of fins extending in a direction substantially orthogonal to the main surface of the base portion. The heat dissipation fin 18a is disposed on the upper portion of the Peltier element 17a such that one of the main surfaces of the base portion (the main surface opposite to the fin portion) is in contact with the main surface of the Peltier element 17a (the main surface opposite to the main surface in contact with the IC socket 12). The heat dissipation fin 18a is made of an aluminum material or the like, and is bonded to the Peltier element 17a using an adhesive having thermal conductivity, thermal conductive grease, or the like.

The IC module inspection device 30a of FIG. 2 further includes a heat dissipation fin 18b that cools a Peltier element 17b and the Peltier element 17b as a contact type temperature control device also on a lower main surface (a main surface opposite to the main surface on which the IC socket 12 is disposed) of the PCB 11. The Peltier element 17b and the heat dissipation fin 18b are a large Peltier element for controlling the temperature of the entire range of the PCB 11 and a fin for cooling.

Similarly to the heat dissipation fin 18a, the heat dissipation fin 18b includes a plate-shaped base portion and a fin portion. The heat dissipation fin 18b is disposed on the lower portion of the Peltier element 17b such that one of the main surfaces of the base portion (the main surface opposite to the fin portion) is in contact with the main surface of the Peltier element 17b (the main surface opposite to the main surface in contact with the IC socket 12). The heat dissipation fin 18b is made of an aluminum material or the like, and is bonded to the Peltier element 17 using an adhesive having thermal conductivity, thermal conductive grease, or the like.

The IC module inspection device 30a of FIG. 2 is different from the IC module inspection device 10b of FIG. 1b in that the lower surface of the PCB 11 includes the Peltier element 17b and the heat dissipation fin 18b that cools the Peltier element 17b. In the IC module inspection device 30a of the present embodiment, the Peltier element 17a and the heat dissipation fin 18a can change the temperature on the upper surface side of the optical semiconductor module 20 mounted on the IC socket 12, and the Peltier element 17b and the heat dissipation fin 18b can change the temperature on the lower surface side of the optical semiconductor module 20. Consequently, the temperature inside the optical semiconductor module 20 can be adjusted without a difference between the upper side and the lower side, and the temperature characteristic of optical semiconductor module 20 can accurately be inspected. In addition, since the jet air is not used, there is no influence on the inspection result due to the shake of the optical fiber 21 by the jet air.

The contact type temperature control device may include a cooling fan 22 (22a and 22b) in addition to the Peltier element and the heat dissipation fin.

Second Embodiment

In a case where the semiconductor module is inspected under the condition of the dew point of the surrounding environment or less using the IC module inspection device 30a of the first embodiment described above with reference to FIG. 2, dew condensation occurs.

FIGS. 3a and 3b are diagrams schematically illustrating a semiconductor module inspection device according to a second embodiment of the present invention capable of preventing dew condensation. The configuration of an IC module inspection device 30b of the present embodiment is a configuration in which a chamber structure is added to the configuration of the IC module inspection device 30a of FIG. 2.

As illustrated in FIG. 3a, the IC module inspection device 30b that is a semiconductor module inspection device according to the present embodiment includes the PCB 11, the IC socket 12 having the contact pin 13 disposed on the PCB 11, the heat dissipation fin 18a that cools the Peltier element 17a and the Peltier element 17a provided above the IC socket 12, the heat dissipation fin 18b that cools the Peltier element 17b and the Peltier element 17b provided below the PCB 11, and a chamber structure having a chamber upper portion 40a and a chamber lower portion 40b.

The chamber upper portion 40a includes a plate-shaped base and a side wall disposed at an outer edge of the base, and has an overall shape of a concave shape having an opening on a lower side. Similar to the chamber upper portion 40a, the chamber lower portion 40b also includes a plate-shaped base and a side wall disposed at an outer edge of the base, and has an overall shape of a concave shape having an opening on an upper side. The chamber upper portion 40a and the chamber lower portion 40b are configured such that a part of a side wall of the chamber upper portion 40a and a part of a side wall of the chamber lower portion 40b are fitted in contact with each other in a state where the optical semiconductor module 20 is mounted on the IC socket 12. As a result, a test environment including the semiconductor module amounted on the IC socket 12 is formed, for example, in the chamber internal space formed in a state where a part (for example, an end portion) of the side wall of the chamber upper portion 40a and a part (for example, an end portion) of the side wall of the chamber lower portion 40b are fitted to each other.

The base portion of the chamber upper portion 40a has an opening. The edge of the opening of the chamber upper portion 40a and the edge of the base of the heat dissipation fin 18a are bonded and fixed such that the fin portion of the heat dissipation fin 18a provided in the upper portion of the IC socket 12 protrudes to the chamber outer space and the position of the Peltier element 17a is in the chamber internal space. In short, the base portion of the heat dissipation fin 18a, which is the heat dissipation surface of the temperature control device, is connected to the chamber upper portion 40a. The base portion of the chamber lower portion 40b also has an opening similarly to the chamber upper portion 40a. The edge of the opening and the edge of the base of the heat dissipation fin 18b are bonded and fixed such that the fin portion of the heat dissipation fin 18b provided on the lower surface side of the PCB 11 protrudes into the chamber outer space and the position of the Peltier element 17b is in the chamber internal space. In short, the base portion of the heat dissipation fin 18b, which is the heat dissipation surface of the temperature control device, is connected to the chamber lower portion 40b. A part of the base portion of the heat dissipation fins 18a and 18b configures a part of the chamber structure together with the base portion of the chamber upper portion 40a and the chamber lower portion 40b, so that the heat of the Peltier elements 17a and 17b is released to the space outside the chamber. As an adhesive for bonding and fixing the edge of the opening portion of the chamber upper portion 40a and the edge of the base portion of the heat dissipation fin 18a, the chamber itself may also serve as the heat dissipation surface of the temperature control device using an adhesive having high thermal conductivity, or only the heat dissipation fin 18a may serve as the heat dissipation surface by using an adhesive having high thermal insulation.

Alternatively, with regard to the fixing between the edge of the opening of the chamber upper portion 40a and the edge of the base portion of the heat dissipation fin 18a, a structure may be employed in which a rail or the like is attached to the heat dissipation fin 18*a* and the chamber upper portion 40*a* is slid with respect to the heat dissipation fin 18*a* without adhering and fixing the chamber upper portion 40*a* and the heat dissipation fin 18*a*. In this way, the chamber upper portion 40*a* and the chamber lower portion 40*b* are fitted not to be affected by mechanical tolerance, and the influence of the atmosphere flowing into the chamber can be eliminated by the gap between the chamber upper portion 40*a* and the chamber lower portion 40*b*.

The chamber structure is provided with a cable extraction port for extracting the cable 15 connected to the connector 14 and the optical fiber 21 connected to the optical semiconductor module 20 from the chamber internal space.

FIG. 3*b* illustrates a state in which the optical semiconductor module 20 is mounted on the IC socket 12 of the IC module inspection device 30*b* of the present embodiment. The IC socket 12 is divided into two parts of a lid part and a recessed part. A lid portion of the IC socket 12 is bonded and fixed to the Peltier element 17*a*, and a recessed portion of the IC socket 12 is bonded and fixed to the Peltier element 17*b*. The optical semiconductor module 20 is mounted in the recessed portion of the IC socket 12 having the contact pin 13, then the optical fiber 21 connected to the optical semiconductor module 20 is guided to the chamber external space through the cable extraction port provided on the side of the recessed portion of the IC socket 12 and the cable extraction port provided on the side wall of the chamber structure, and finally the lid portion of the IC socket 12 integrated with the chamber upper portion 40*a* is installed in the optical semiconductor module 20.

As illustrated in FIGS. 3*a* and 3*b*, the IC module inspection device 30*b* of the present embodiment includes at least one purge mechanism in at least one of the chamber upper portion 40*a* and the chamber lower portion 40*b*. The purge mechanism may be, for example, a purge hole 41. The purge mechanism is a mechanism for purging the chamber internal space being inspected with dried air. As a result, in the IC module inspection device 30*b* of the present embodiment, it is possible to perform the inspection while preventing the dew condensation even at the dew point or less.

Third Embodiment

Figure 4:
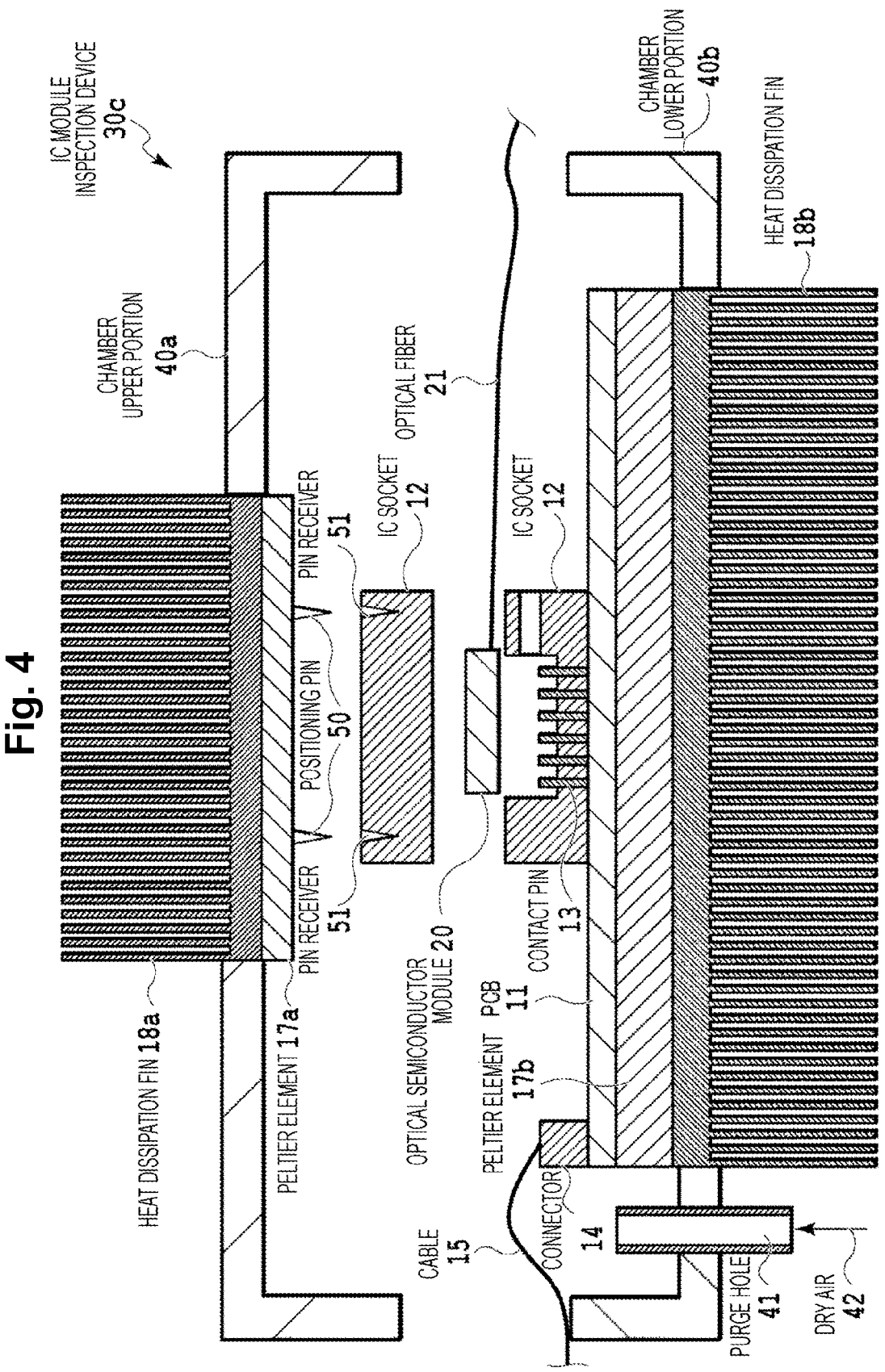
FIG. 4 is a schematic configuration diagram of a semiconductor module inspection device according to an embodiment of the present invention.

FIG. 4 is a schematic configuration diagram of a semiconductor module inspection device according to an embodiment of the present invention. The semiconductor module inspection device according to the present embodiment is a modification embodiment of a semiconductor module inspection device according to a second embodiment.

As illustrated in FIG. 4, in an IC module inspection device 30*c* which is a semiconductor module inspection device, the lid portion of the IC socket 12 is not bonded and fixed to the Peltier element 17*a*, and the lid portion of the IC socket 12 and the Peltier element 17*a* can be separated from each other. On the other hand, the IC module inspection device 30*c* includes a positioning mechanism for aligning the lid portion of the IC socket 12 and the Peltier element 17*a*. The positioning mechanism includes a positioning pin 50 and a pin receiver 51 into which the positioning pin 50 is fitted. In the IC module inspection device 30*c* of the present embodiment, the Peltier element 17*a* includes the positioning pin 50 on the main surface (the main surface in contact with the IC socket 12 and the main surface opposite to the heat dissipation fin 18*a*), and the lid portion of the IC socket 12 includes the pin receiver 51.

According to the IC module inspection device 30*c* of the present embodiment, even when the lid portion of the IC socket 12 includes a torque management screw (not illustrated) or the like for controlling an appropriate load on the optical semiconductor module 20, the optical semiconductor module 20 can be mounted on the IC socket 12, the lid portion of the IC socket 12 can be installed on the optical semiconductor module 20, torque management is performed by the torque management screw, and then the Peltier element 17*a* can be separately attached to the upper portion of the lid portion of the IC socket 12.

INDUSTRIAL APPLICABILITY

According to the above-described various embodiments, it is possible to provide an optical semiconductor module inspection device capable of simply and uniformly adjusting the temperature of the optical semiconductor module.

REFERENCE SIGNS LIST

10*a*, 10*b*, 10*c*, 30*a*, 30*b*, 30*c* IC module inspection device
11 PCB
12 IC socket
13 Contact pin
14 Connector
15 Cable
16 Jet air device
17, 17*a*, 17*b* Peltier element
18, 18*a*, 18*b* Heat dissipation fin
19 Thermostatic bath
191 Cable extraction port
20 Optical semiconductor module
21 Optical fiber
22, 22*a*, 22*b* cooling fan
40*a* Chamber upper portion
40*b* Chamber lower portion
41 Purge hole
42 Dried air
50 Positioning pin
51 Pin receiver

The invention claimed is:

1. A semiconductor module inspection device, comprising:
   a printed circuit board (PCB) substrate;
   an integrated circuit (IC) socket that accommodates a semiconductor module disposed on a first main surface of the PCB substrate;
   a first temperature control device disposed in contact with an upper surface of the IC socket;
   a second temperature control device disposed in contact with a second main surface of the PCB substrate; and
   a chamber structure including a chamber upper portion in direct contact with a heat dissipation surface of the first temperature control device and a chamber lower portion in direct contact with a heat dissipation surface of the second temperature control device.

2. The semiconductor module inspection device according to claim 1, wherein the first temperature control device and the second temperature control device have a Peltier element and a heat dissipation fin.

3. The semiconductor module inspection device according to claim 2, wherein the first temperature control device and the second temperature control device further include a cooling fan.

4. The semiconductor module inspection device according to claim 3, wherein the chamber upper portion and the chamber lower portion are fitted to each other to form a chamber internal space, and the chamber structure includes a purge mechanism for purging the chamber internal space with dried air.

5. The semiconductor module inspection device according to claim 4, further comprising:

a positioning mechanism including a positioning pin for positioning the IC socket and the first temperature control device, and a pin receiver to be fitted with the positioning pin, wherein the first temperature control device includes the positioning pin, and a lid portion of the IC socket includes the pin receiver.

6. The semiconductor module inspection device according to claim 3, further comprising:

a positioning mechanism including a positioning pin for positioning the IC socket and the first temperature control device, and a pin receiver to be fitted with the positioning pin, wherein the first temperature control device includes the positioning pin, and a lid portion of the IC socket includes the pin receiver.

7. The semiconductor module inspection device according to claim 2, wherein the chamber upper portion and the chamber lower portion are fitted to each other to form a chamber internal space, and the chamber structure includes a purge mechanism for purging the chamber internal space with dried air.

8. The semiconductor module inspection device according to claim 7, further comprising:

a positioning mechanism including a positioning pin for positioning the IC socket and the first temperature control device, and a pin receiver to be fitted with the positioning pin, wherein the first temperature control device includes the positioning pin, and a lid portion of the IC socket includes the pin receiver.

9. The semiconductor module inspection device according to claim 2, further comprising:

a positioning mechanism including a positioning pin for positioning the IC socket and the first temperature control device, and a pin receiver to be fitted with the positioning pin, wherein the first temperature control device includes the positioning pin, and a lid portion of the IC socket includes the pin receiver.

10. The semiconductor module inspection device according to claim 1, wherein the chamber upper portion and the chamber lower portion are fitted to each other to form a chamber internal space, and the chamber structure includes a purge mechanism for purging the chamber internal space with dried air.

11. The semiconductor module inspection device according to claim 10, further comprising:

a positioning mechanism including a positioning pin for positioning the IC socket and the first temperature control device, and a pin receiver to be fitted with the positioning pin, wherein the first temperature control device includes the positioning pin, and a lid portion of the IC socket includes the pin receiver.

12. The semiconductor module inspection device according to claim 1, further comprising:

a positioning mechanism including a positioning pin for positioning the IC socket and the first temperature control device, and a pin receiver to be fitted with the positioning pin, wherein the first temperature control device includes the positioning pin, and a lid portion of the IC socket includes the pin receiver.

13. A semiconductor module inspection device, comprising:

a printed circuit board (PCB) substrate;

an integrated circuit (IC) socket that accommodates a semiconductor module disposed on a first main surface of the PCB substrate;

a first temperature control device disposed in contact with an upper surface of the IC socket;

a second temperature control device disposed in contact with a second main surface of the PCB substrate; and a chamber structure including a chamber upper portion in direct contact with a heat dissipation surface of the first temperature control device and a chamber lower portion in direct contact with a heat dissipation surface of the second temperature control device, and wherein the chamber upper portion comprises an opening, and an edge of the opening of the chamber upper portion contacts an edge of the first temperature control device, and wherein the chamber lower portion comprises an opening, and an edge of the opening of the chamber lower portion contacts an edge of the second temperature control device.

* * * * *